United States Patent

Seki

[11] Patent Number: 5,774,068
[45] Date of Patent: Jun. 30, 1998

[54] ABSOLUTE SIGNAL DETECTING METHOD AND ABSOLUTE ENCODER

[75] Inventor: Shigeo Seki, Iida, Japan

[73] Assignee: Tamagawa Seiki Kabushiki Kaisha, Nagano-ken, Japan

[21] Appl. No.: 560,575

[22] Filed: Nov. 20, 1995

Related U.S. Application Data

[63] Continuation-in-part of Ser. No. 357,439, Dec. 16, 1994, abandoned.

[30] Foreign Application Priority Data

Mar. 29, 1994 [JP] Japan ................................ 6-59281

[51] Int. Cl.[6] .............................................. G08C 19/00
[52] U.S. Cl. ............................... 340/870.31; 340/870.29; 250/231.14; 250/231.18; 341/3; 341/6; 341/11; 341/13
[58] Field of Search .................... 340/870.01, 870.02, 340/870.19, 870.31, 870.35, 870.43, 870.27, 870.28, 870.29, 870.37; 341/3, 6, 7, 11, 13; 250/231.13, 231.14, 231.15, 231.16, 231.17, 231.18

[56] References Cited

U.S. PATENT DOCUMENTS

| | | | |
|---|---|---|---|
| 4,737,187 | 4/1988 | Kibrick et al. ............................ | 341/3 |
| 5,231,596 | 7/1993 | Nakazawa et al. ...................... | 364/560 |
| 5,418,362 | 5/1995 | Lusby et al. ........................ | 250/231.18 |
| 5,438,193 | 8/1995 | Takagi et al. ....................... | 250/231.18 |

FOREIGN PATENT DOCUMENTS

| | | |
|---|---|---|
| 341314 | 11/1989 | European Pat. Off. . |
| 2-35314 | 2/1990 | Japan . |

OTHER PUBLICATIONS

Electronic Letters, vol. 25, No. 21, Oct. 21, 1989, pp. 1436–1437.

*Primary Examiner*—Thomas Mullen
*Assistant Examiner*—Ashok Mannava
*Attorney, Agent, or Firm*—Brooks Haidt Haffner & Delahunty

[57] ABSTRACT

A code plate has an m-bit signal track read out in parallel for providing the starting position of an AC servo motor for commencing rotation when power is first turned ON. An n-bit signal track accompanied by an incremental signal track is provided on the code plate with the n-bit track read out serially, converted to pure binary in parallel, and used once rotation of the servo motor commences to provide the initial absolute value of the encoder. To this n-bit initial value is added signals from the incremental track upon continued rotation of the code plate.

5 Claims, 6 Drawing Sheets

ABSOLUTE SIGNAL DETECTING METHOD AND ABSOLUTE ENCODER

BACKGROUND OF THE INVENTION

This application is a continuation-in-part of my prior application, Ser. No. 08/357,439, filed Dec. 16, 1994, now abandoned.

1. Field of the Invention

The present invention relates to an absolute signal detecting method and an absolute encoder, and more particularly, to obtaining an absolute encoder in a structure almost similar to an incremental encoder, and for enabling an AC servo motor to immediately start up through detecting the positions of the magnetic poles in the AC servo motor when power is first turned ON.

2. Description of the Related Art

Heretofore, commonly used absolute encoders each use a one-track type of n-bit positional signals, detect said n-bit positional signals through disposing n pieces of light receiving elements corresponding to the n bits toward the track (toward the circumference), and output the n-bit positional signals as positional signals accompanying displacement of an input axis position of the encoder.

With conventional encoders composed as above described, there are a number of issues. The required number of signal processing circuits corresponding to the n elements that correspond to said n bits is n circuits. Problems such as signal adjustment of each of the n circuits exist due to variation including frequency characteristics between the n circuits, and hence it is very difficult to produce absolute encoders with high reliability.

The present invention is to solve above issues, and in particular, objects of the present invention are to obtain an absolute signal detecting method and an absolute encoder in a structure almost similar to an incremental encoder, and to enable an AC servo motor to immediately start up through detecting the positions of the magnetic poles in the AC servo motor when power is first turned ON.

SUMMARY OF THE INVENTION

An absolute signal detecting method according to the present invention uses an n-bit positional signal provided along a first track of a code plate, an incremental signal related to said n-bit signal provided along a second track of said code plate, said absolute signal detecting method comprising the steps of providing on said code plate a third track containing an m-bit signal where said m-bit signal is representative of the magnetic pole positions of the rotating member of an AC servo motor; reading said m-bit signal at the time of turning power ON and loading said read m-bit signal into a counting circuit; subsequently reading said n-bit signal from said code plate and loading said read n-bit signal into said counting circuit to replace said m-bit signal; and adding to said loaded n-bit signal signals read from said incremental track to detect the angular position of said rotating member of said servo motor.

In further detail, this is a method which further comprises using a latch circuit to read said n-bit signal at the instants when said incremental signal changes its value; and loading said read n-bit signal through a parallel signal converter into said counting circuit.

In still further detail, this is a method in which said counting circuit counts up and down said incremental signal depending upon the direction of rotation of said servo motor.

An absolute encoder according to the present invention detects an absolute signal using an n-bit positional signal formed at one track of a code plate and an incremental signal corresponding to said n bits, said absolute encoder comprising an UP/DOWN circuit where said incremental signal is inputted, a counting circuit connected to said UP/DOWN circuit, a latch circuit where said n-bit positional signal and said incremental signal are inputted, a parallel signal converter connected to said latch circuit and said counting circuit, a pure binary signal converter and data selector provided between said parallel signal converter and said counting circuit, and a load command circuit connected to said pure binary signal converter, data selector, counting circuit and a power ON/OFF signal.

In an absolute signal detecting method and an absolute encoder according to the present invention, at power ON an m-bit positional signal provided on a code plate which signal is a detection signal for the magnetic poles in an AC servo motor, is read into a data selector, and this m-bit positional signal from the data selector is read into a counting circuit as a first load. Next, using this m-bit positional signal, the AC servo motor is minutely ($360°/2^n$) rotated, an n-bit positional signal is scanned and detected with an incremental signal corresponding to the n-bits, using a latch circuit, and a second load is performed setting this n-bit positional signal as an absolute value in said counting circuit.

After completion of the loading of the n-bit signal, this encoder makes the counting circuit count up or down with the incremental signal, and obtains an absolute signal through adding the incremental signal to the absolute value composed of the n-bit positional signal stored in the counting circuit at the above described second load.

BRIEF DESCRIPTION OF THE DRAWINGS

The same reference numerals are used throughout the drawings to designate the same or similar parts.

DETAILED DESCRIPTION OF THE PREFERRED EMBODIMENTS

Hereafter, the presently preferred embodiments of the signal detecting method and absolute encoder according to the present invention will be explained in detail with reference to the appended drawings.

Figure 1:
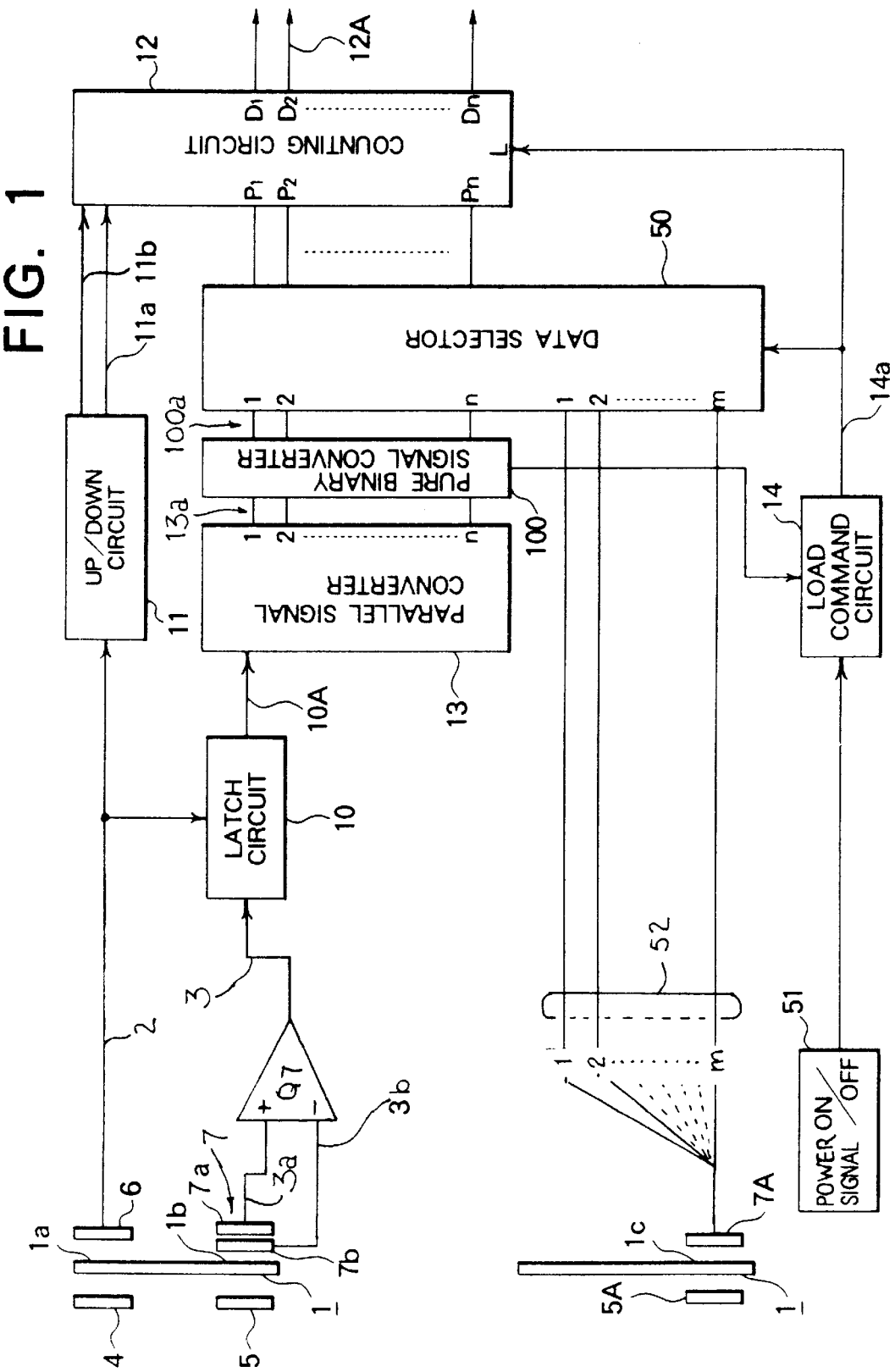
FIG. 1 is a schematic block diagram showing an absolute encoder according to the present invention.

Referring to FIG. 1, there is shown a code plate 1. The code plate 1 has a first track, 1a, with a code for an incremental signal to be described further, a second track, 1b, with a code for an n-bit positional signal to be described, and a third track, 1c, with a code corresponding to an m-bit positional signal to be described that functions as a detecting signal for the magnetic poles in an AC servo motor. Although in FIG. 1 two code plates are provided, a common plate is used practically. On the left of this code plate 1 as seen in FIG. 1, a first light source 4, second light source 5, and third light source 5A corresponding to respective tracks 1a, 1b, and 1c are provided individually, or a common light source is used occasionally.

A light receiving section 6 for the incremental signal, a light receiving section 7 for the n-bit signal, and a light receiving section 7A for the m-bit positional signal are provided for the respective tracks 1a, 1b, and 1c.

Before proceeding further with an explanation of FIG. 1, the details of the code plate 1 and its associated light receiving sections 6, 7 and 7A will be described with reference to FIGS. 3 to 6 to which attention should now be directed.

Figure 4:
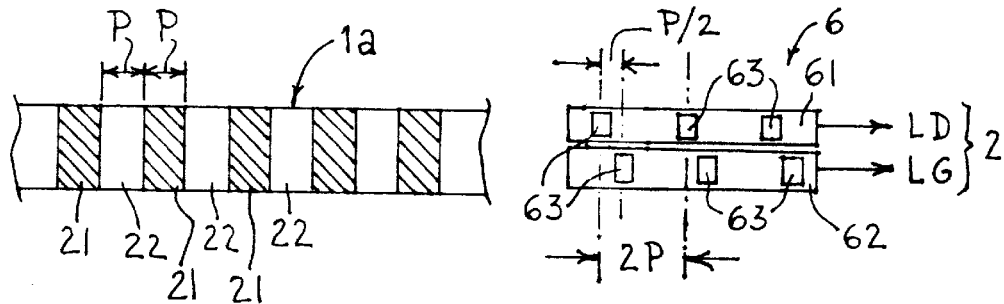
FIG. 4 is a diagrammatic representation of an incremental code track used in the embodiment of FIG. 1.

A segment of a typical incremental track 1a is shown in FIG. 4 as consisting of a series of transparent rectangular areas 21 alternating with opaque areas 22 of equal width, P, provided along a circular track over a full 360°.

Figure 5:
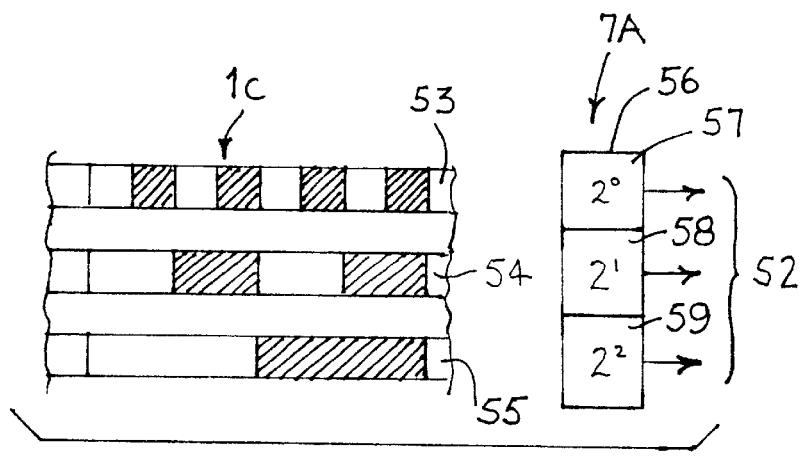
FIG. 5 is a diagrammatic representation of an m-bit track used in the embodiment of FIG. 1.
Figure 5:
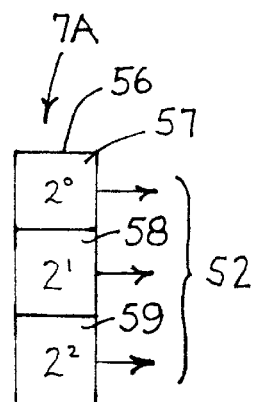
Figure 6:
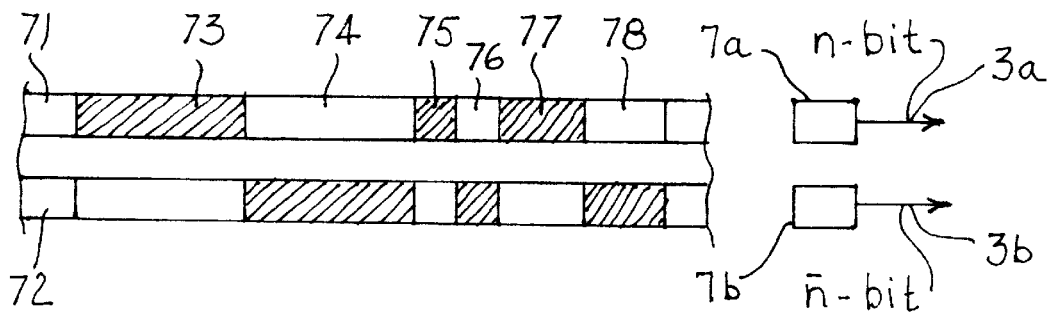
FIG. 6 is a diagrammatic representation of an illustrative n-bit and $\bar{n}$-bit track as used in the embodiment of FIG. 1.

For convenience the tracks in FIGS. 4, 5 and 6 are drawn as straight lines. It should be understood, however, that the tracks are circular, concentric with the center of rotation of the code plate 1.

Figure 3:
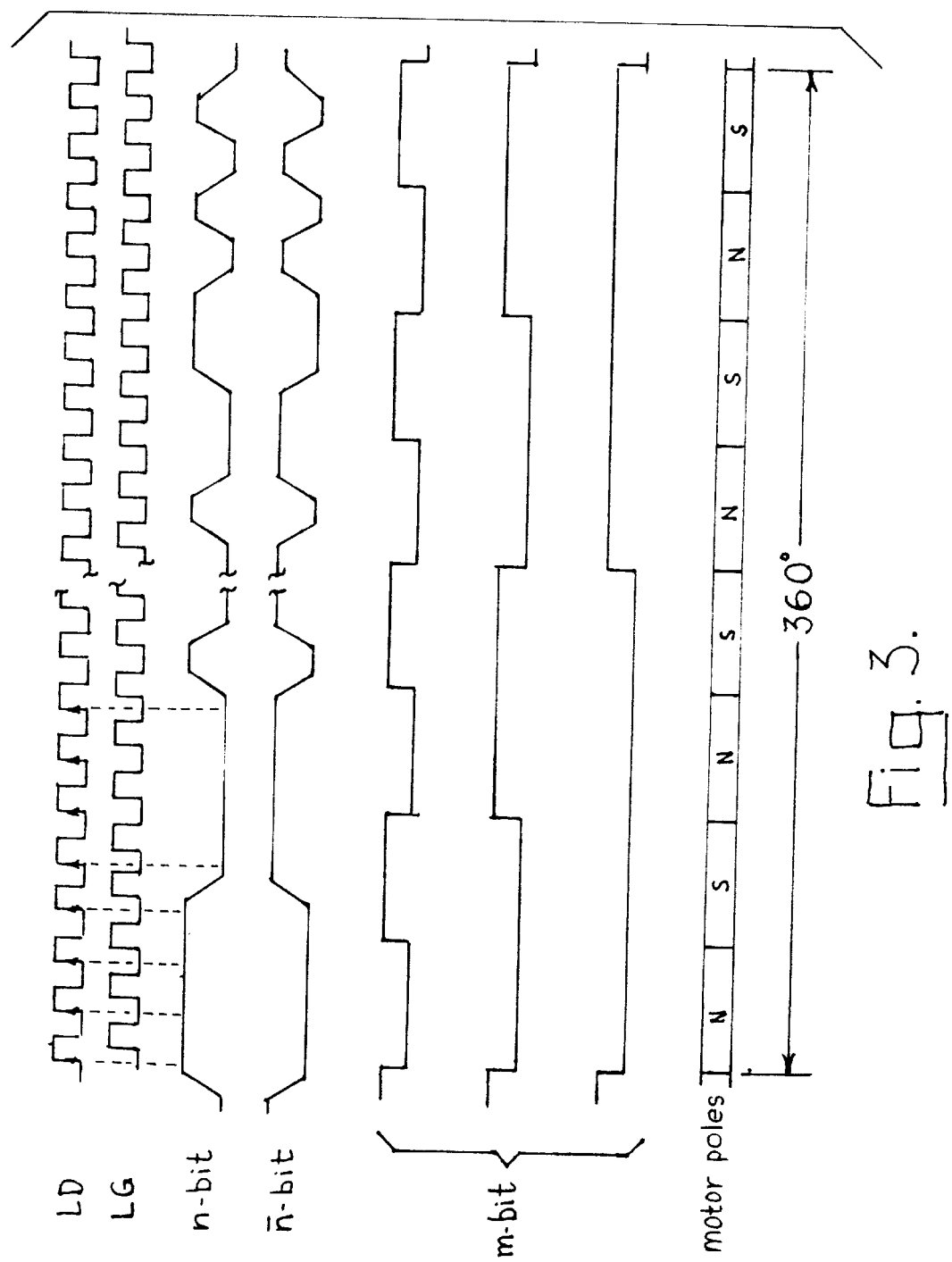
FIG. 3 is a diagrammatic representation of code tracks useful in explaining the embodiment of FIG. 1.

Positioned adjacent the track 1a is the light receiving section 6 consisting of two pickups, 61 and 62, provided with masks containing slits 63, spaced as shown. The pickup 61 has an output lead labeled LD while the pickup 62 has an output lead labeled LG. When the code plate 1 rotates causing the track 1a to travel past the pickups 61 and 62, signals appear on leads LD and LG as shown in FIG. 3.

In FIG. 5 there is shown a segment of the m-bit track. In this example m has the value of 3. Therefore, it consists of three lines, 53, 54 and 55, each containing alternating opaque and transparent areas along concentric circular paths about the code plate 1. As seen in FIG. 5, the line 54 has areas of twice the arc extent as those in line 53, while the arc extent of the areas in line 55 are twice that of those in line 54. When a radially oriented pickup 56 having separate segments 57 to 59, one for each of the lines 53 to 55, is positioned adjacent the track 1c, the segments 57 to 59 will provide signals representing $2^0, 2^1, 2^2$ and so forth providing a parallel signal output representative of a binary number. If the full 360° track is as shown in FIG. 3, a discrete binary number will be provided on output 52 corresponding to one of the poles of the associated servo motor as shown in FIG. 3.

Finally, there is shown in FIG. 6 a fragment of both the n-bit line 71 and the n-bit line 72 with associated pickups or light receiving sections 7a and 7b, respectively. The $\overline{n}$-bit line 72 is the complement of the n-bit line 71. Both lines contain transparent and opaque areas representing the binary value of a binary number. However, while the m-bit track is provided in parallel format, the n-bit track is in serial format. In the example, the transparent area 73 has a 4-unit arcuate extent where n=4. The opaque area 74 also has a 4-unit arcuate extent. Areas 75 and 76 are of 1-unit arcuate extent, while areas 77 and 78 are of 2-unit arcuate extent. When the disc 1 rotates, passage of track 1b past the light receiving sections 7a and 7b will provide the signals $\overline{n}$-bit and n-bit on leads 3a and 3b as shown in FIG. 3.

Returning to FIG. 1, the n-bit signal 3a and $\overline{n}$-bit signal 3b are applied through a comparator $Q_7$ over connection 3 to one input of a latch circuit 10. The comparator can be a type LM339 device produced by Texas Instruments, Inc.

The light receiving section 6 provides its outputs LD and LG over a cable 2 to both the latch circuit 10 and an UP/DOWN circuit 11. The latch circuit is shown in detail in FIG. 2 as consisting of a series of flip-flop circuits $Q_1$, $Q_2$ and $Q_6$ and logic devices $Q_3$, $Q_4$ and $Q_5$. As shown, the LD signal is applied to the D input of flip-flop $Q_1$. The Q output of $Q_1$ is applied to both the D input of $Q_2$ and one input of AND gate $Q_3$. The $\overline{Q}$ output of $Q_1$ is applied to one input of AND gate $Q_4$. The Q output of $Q_2$ is applied to a second input of AND gate $Q_4$ while the $\overline{Q}$ output of $Q_2$ is applied to a second input of gate $Q_3$. The C inputs of $Q_1$ and $Q_2$ are supplied with clock pulses from a CLK source (not shown) operating preferably at 20 MHz. The LG signal is applied through an inverter 23 to a third input of each AND gate $Q_3$ and $Q_4$. The output of each AND gate $Q_3$ and $Q_4$ is applied to an input of an OR gate $Q_5$ whose output feeds the C input of flip-flop $Q_6$. The D input of $Q_6$ is fed with the signal on lead 3 from the comparator $Q_7$. The Q output of flip-flop $Q_6$ provides a signal 10A which, as shown in FIG. 1, is applied to a parallel signal converter 13.

Figure 8:
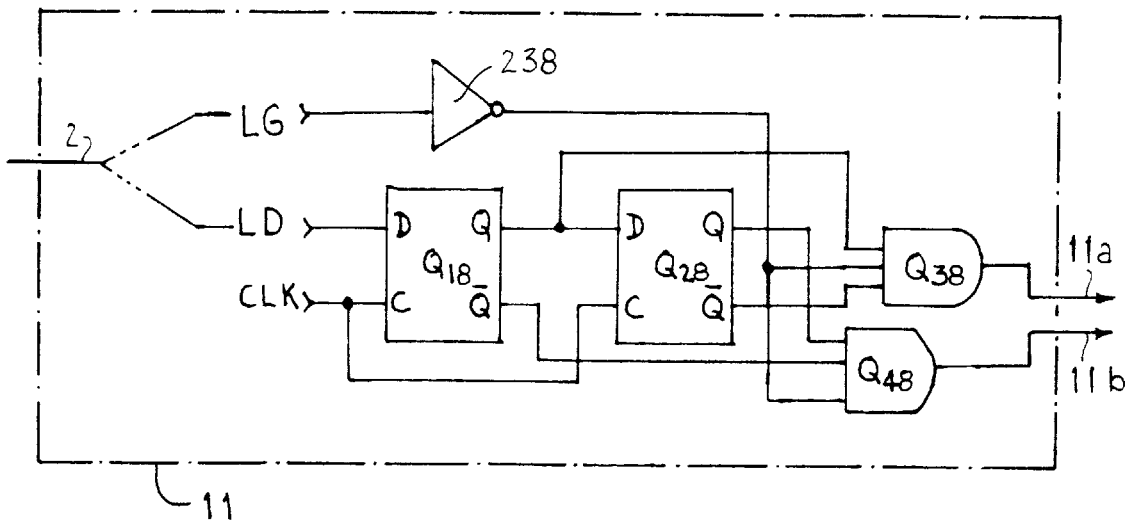
FIG. 8 is a logic diagram showing the details of the UP/DOWN CIRCUIT of FIG. 1.

Before describing the operation of the latch circuit 10, it will be helpful to understand the operation of the UP/DOWN circuit 11 shown in FIG. 8. A quick comparison of FIG. 8 with FIG. 2 should reveal the similarity. In FIG. 8, the numeral 8 has been appended as the last digit of the reference characters otherwise used in FIG. 2. Thus, flip-flops $Q_{18}$ and $Q_{28}$ are identical respectively, with flip-flops $Q_1$ and $Q_2$, while AND gates $Q_{38}$ and $Q_{48}$ are identical to gates $Q_3$ and $Q_4$. Inverter 238 is identical to inverter 23. The interconnections of the components in FIG. 8 are the same as in FIG. 2.

Figure 9:
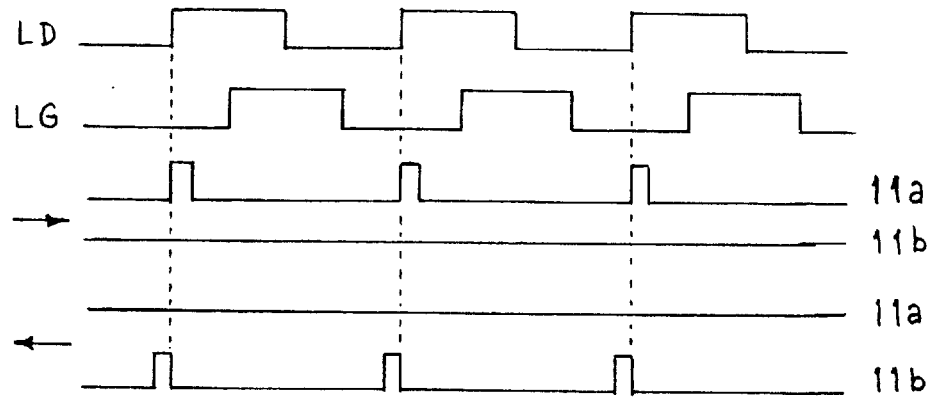
FIG. 9 is a family of curves used to explain the operation of the UP/DOWN CIRCUIT of FIG. 8.

When the LG and LD signals applied to the UP/DOWN Circuit 11 are as shown in FIG. 9, the output signals on leads 11a and 11b will be as shown in FIG. 9 depending upon the direction of rotation of the code plate 1 as indicated by the arrows to the left of the curves. Thus, when the disc is rotating counterclockwise in front of the pickups such that the LD and LG lines are read from left to right as viewed in FIG. 9, a series of spaced pulses will appear on output 11a while zero output appears on output 11b. When the code plate 1 is rotating clockwise, the lines LD and LG are read from right to left and now the output pulses appear on output 11b.

As shown in FIG. 1, the outputs 11a and 11b are applied to a counting circuit 12, the output 11a being applied to an input for incrementing the count while the output 11b is applied to an input for decrementing the count in the counting circuit 12.

Referring again to FIG. 9, it will be seen that the leading edges of the pulses on lines 11a and 11b coincide with leading (counterclockwise rotation) or trailing (clockwise rotation) edges of the LD signal pulses representing logic 1. Now, referring to FIG. 2, it will be seen that the signals 11a and 11b (the outputs from AND gates $Q_3$ and $Q_4$) are applied to the OR gate $Q_5$. Therefore, $Q_5$ supplies a pulse to the C input of flip-flop $Q_6$ at the same repetition rate regardless of the direction of rotation of the code plate 1.

Figure 2:
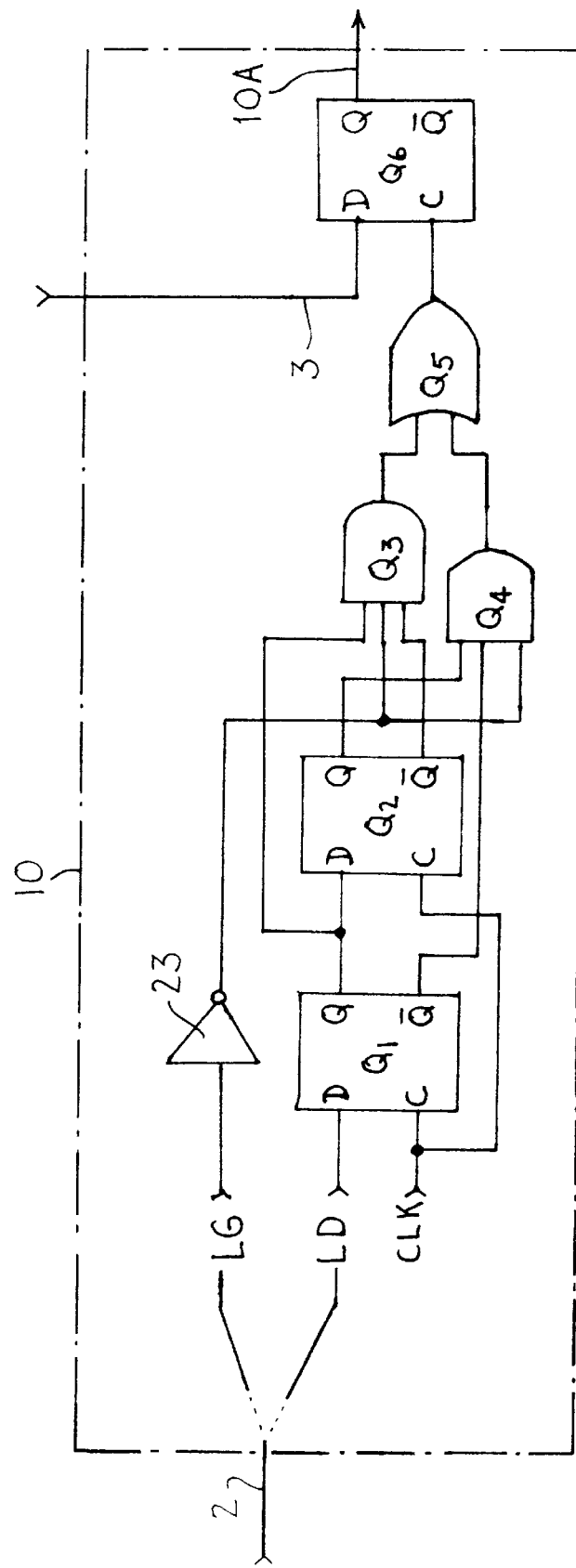
FIG. 2 is a logic diagram showing the details of the latch circuit in the embodiment of FIG. 1.
Figure 7:
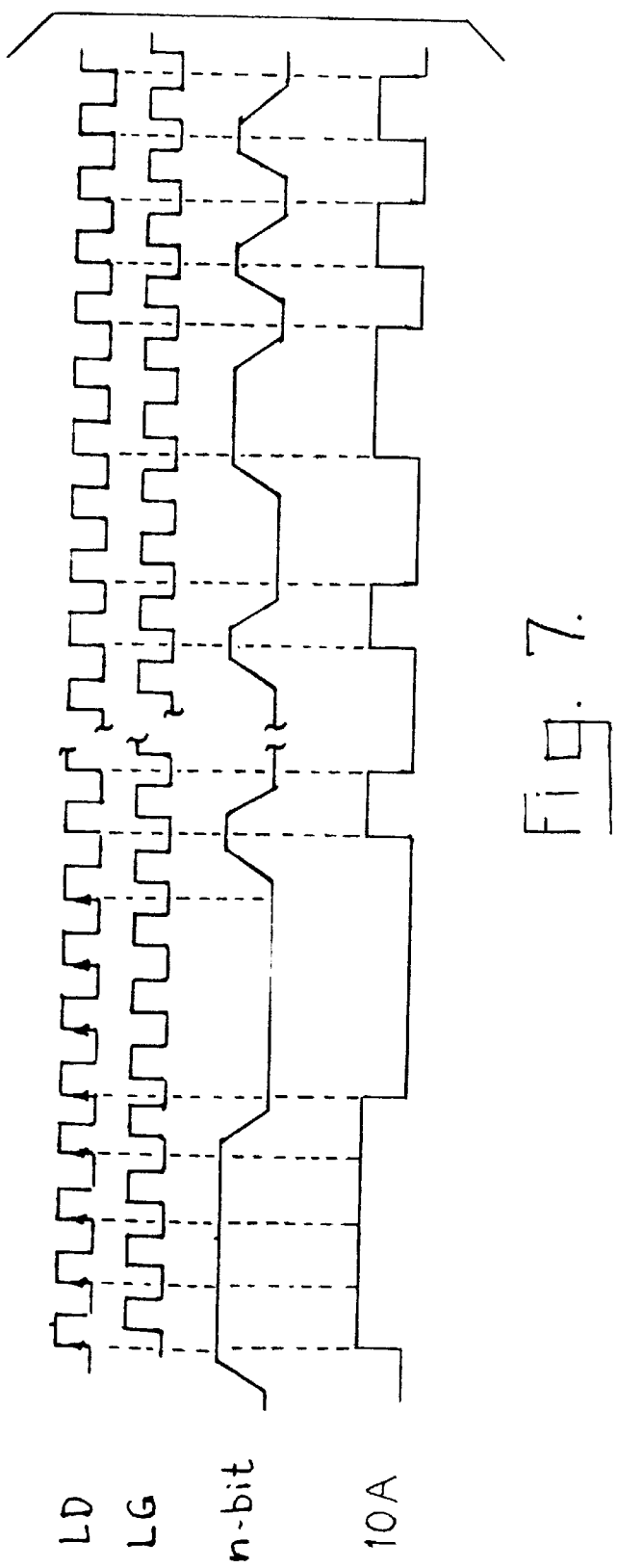
FIG. 7 is a family of curves used to explain the operation of the latch circuit of FIG. 2.

Referring now to FIG. 7, there is shown the output signal 10A provided by the circuit of FIG. 2 from the LD, LG and n-bit signals.

Attention should now be directed to FIG. 1 wherein it can be seen that the output 10A of the latch circuit 10 is applied to an input of a parallel signal converter 13 for conversion from a serial to a parallel signal. The converter 13 will have n stages equal in number to the value of n in the n-bit signal.

The output from the converter 13 is designated 13a and is applied to a pure binary signal converter 100 providing an output 100a of $2^n$ maximum value. The output 100a is applied to a data selector 50 which, in turn, provides a parallel signal output to the counting circuit 12.

The data selector 50 has additional inputs connected to the cable 52 for receiving the m-bit signals provided by the light receiving section 7A.

Control of the data selector 50 is provided by a load command circuit 14 over connection 14a. The load command circuit 14 receives control signals from the pure binary signal converter 100 and from a power ON/OFF signal source 51.

The operation of the absolute signal encoder can now be described. When the power is first turned ON a signal is provided from the power ON/OFF signal device 51 causing the load command circuit 14 to signal the data selector 50 to transfer the m-bit signal received over cable 52 to the parallel input of the counting circuit 12 to be stored therein as an initial or first load. The m-bit signal indicates the angular orientation of the rotary element of the servo motor and thus the magnetic pole relationship to enable driving the AC servo motor through the output 12A of the counting circuit 12.

Subsequently, using the output 12A corresponding to the initial m-bit signal, the AC servo motor (not shown) is rotated minutely, i.e., $360°/2^n$. This causes the code plate 1 to rotate and the n-bit track is scanned. Using the incremental signal on cable 2 and the latch circuit 10, the n-bit signal 3 is detected as previously described and supplied to the parallel signal converter 13 and then to the pure binary signal converter 100.

From the previous discussion it will be understood that the n bits first entered into the parallel signal converter 13 will represent in binary notation some arbitrary value depending upon the starting orientation of the code plate 1. However, it is desired that this starting point or value be considered as the zero point for operation of the encoder. Therefore, the pure binary signal converter 100 is set to binary zero. When the pure binary signal converter 100 receives the input 13A from the parallel signal converter, the pure binary signal converter 100 feeds a signal to the load command circuit 14 which then signals the data selector 50 to transfer the signal 100a as a second loading to be stored in the counting circuit 12. The second load replaces the first load to provide an absolute value positional signal.

After completion of the second load, the code plate 1 continues to rotate with rotation of the AC servo motor. Depending upon the direction of rotation of the code plate 1, the incremental signals over cable 2 from the pickup 6 are processed by the UP/DOWN circuit 11 and applied to the counting circuit 12 to count up or down as previously explained. An absolute signal 12A is obtained by adding the incremental signal over cable 2 to the absolute value provided by the n-bit signal.

The counting circuit 12 outputs an absolute signal 12A by virtue of the fact that the incremental signals are added to the previously loaded n-bit positional signal. For example, if the axis position 100/360° is scanned and loaded, the number 100 becomes the absolute value. The incremental signal on cable 2 is added to this absolute value to provide a continually changing absolute signal for controlling the operation of the AC servo motor.

It is assumed that the absolute encoder of the present invention is mechanically connected to the AC servo motor being controlled. Thus, the driving of the AC servo motor is started by reading the multi-phase detecting signal from the m-bit track 1c when power is first turned ON. Thereafter, due to rotation of the code plate 1 it is possible to read the n-bit track for a more accurate indication of the precise orientation of the servo motor rotary member, and with this initial n-bit track reading, obtain precise indication of the motor rotation by incrementing the count in the counting circuit with signals from the incremental track, 1a.

Since the n-bit signal is in serial form it is not necessary to use n channels of signal processing equipment which would otherwise be needed to process parallel signals. The servo motor is started by reading the m-bit signal whereupon the n-bit signal can be read to provide an absolute signal indicative of motor shaft orientation, and therefore magnetic pole relationships. Thus, there is obtained a significant reduction in hardware.

Furthermore, since the frequency characteristic of the incremental signal is better than that of the n-bit signal due to detection in greater received-light quantity with a plurality of slits, the absolute signal can be obtained with good frequency characteristic. In addition, since the initial position of the rotary member is loaded into the counting circuit, the circuit enables the absolute value to be continually provided merely by adding the incremental signal.

Having described the presently preferred embodiment of the present invention, it should be understood by those skilled in the present art that various changes can be introduced without departing from the true spirit of the invention as defined by the appended claims.

What is claimed is:

1. An absolute signal detecting method using an n-bit positional signal provided along a first track of a code plate and using an incremental signal related to said n-bit signal and provided along a second track of said code plate, said absolute signal detecting method comprising the steps of providing on said code plate a third track containing an m-bit signal where said m-bit signal is representative of the magnetic pole positions of the rotating member of an AC servo motor; reading said m-bit signal at the time of turning power ON and loading said read m-bit signal into a counting circuit; subsequently reading said n-bit signal from said code plate and loading said read n-bit signal into said counting circuit; and adding to said loaded n-bit signal signals read from said incremental track to detect the angular position of said rotating member of said servo motor.

2. An absolute signal detecting method according to claim 1, further comprising the steps of using a latch circuit to read said n-bit signal at the instants when said incremental signal changes its value; and loading said read n-bit signal through a parallel signal converter into said counting circuit.

3. An absolute signal detecting method according to claim 1, wherein said counting circuit is caused to additively count said incremental signals for a first direction of rotation of said servo motor, and to subtractively count said incremental signals for a second direction of rotation of said servo motor.

4. An absolute signal detecting method according to claim 2, wherein said counting circuit is caused to additively count said incremental signals for a first direction of rotation of said servo motor, and to subtractively count said incremental signals for a second direction of rotation of said servo motor.

5. An absolute encoder for providing an absolute signal using an n-bit positional signal formed on one track of a code plate and an incremental signal related to said n-bit signal and formed on another track of said code plate, said encoder comprising an UP/DOWN circuit having an input coupled to means for reading said incremental signal, a counting circuit having an input coupled to an output of said UP/DOWN circuit, a latch circuit having inputs coupled to means for reading said n-bit signal and said incremental signal, a parallel signal converter having an input coupled to an output of said latch circuit, a pure binary signal converter and data selector coupled between an output of said parallel signal converter and input means for said counting circuit, and a load command circuit interconnecting said pure binary signal converter and a source of power ON/OFF signal with said date selector and said counting circuit.

* * * * *